US010811119B1

United States Patent
Hsu et al.

(10) Patent No.: US 10,811,119 B1
(45) Date of Patent: Oct. 20, 2020

(54) POST PACKAGE REPAIR METHOD AND POST PACKAGE REPAIR DEVICE

(71) Applicant: NANYA TECHNOLOGY CORPORATION, New Taipei (TW)

(72) Inventors: Ting-Shuo Hsu, New Taipei (TW); Chih-Wei Shen, Yunlin County (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 16/447,977

(22) Filed: Jun. 21, 2019

(51) Int. Cl.
*G11C 29/00* (2006.01)
*H03K 19/20* (2006.01)

(52) U.S. Cl.
CPC ............ *G11C 29/70* (2013.01); *H03K 19/20* (2013.01)

(58) Field of Classification Search
CPC ..... G11C 29/70; G11C 29/78; G11C 11/4074; G11C 11/408; G11C 17/16; G11C 14/0009; H03K 19/20
See application file for complete search history.

(56) References Cited

U.S. PATENT DOCUMENTS

| 2016/0111171 A1* | 4/2016 | Yang ............... G11C 11/408 365/96 |
| 2016/0260504 A1* | 9/2016 | You ............... G11C 29/787 |
| 2016/0307647 A1* | 10/2016 | Morgan ............ G11C 29/787 |

* cited by examiner

*Primary Examiner* — David Lam
(74) *Attorney, Agent, or Firm* — CKC & Partners Co., LLC

(57) ABSTRACT

A post package repair (PPR) method is disclosed. The PPR method includes the following operations: receiving a first PPR signal and a second PPR signal, in which the first PPR signal corresponds to a first PPR mode, and the second PPR signal corresponds to a second PPR mode; generating a first valid signal and a second valid signal according to the first PPR signal and the second PPR signal, in which only one of the first valid signal and the second valid signal comprises a valid information when both of the first PPR signal and the second PPR signal comprise an enabled information; in which when the first valid signal comprises the valid information, the first PPR mode is executed, and when the second valid signal comprises the valid information, the second PPR mode is executed.

11 Claims, 5 Drawing Sheets

| TMS | PS1 | PS2 | VS1 | VS2 |
|---|---|---|---|---|
| 0 | 0 | 0 | 0 | 0 |
| 0 | 0 | 1 | 0 | 1 |
| 0 | 1 | 0 | 1 | 0 |
| 0 | 1 | 1 | 1 | 0 |
| 1 | 0 | 0 | 0 | 0 |
| 1 | 0 | 1 | 0 | 1 |
| 1 | 1 | 0 | 1 | 0 |

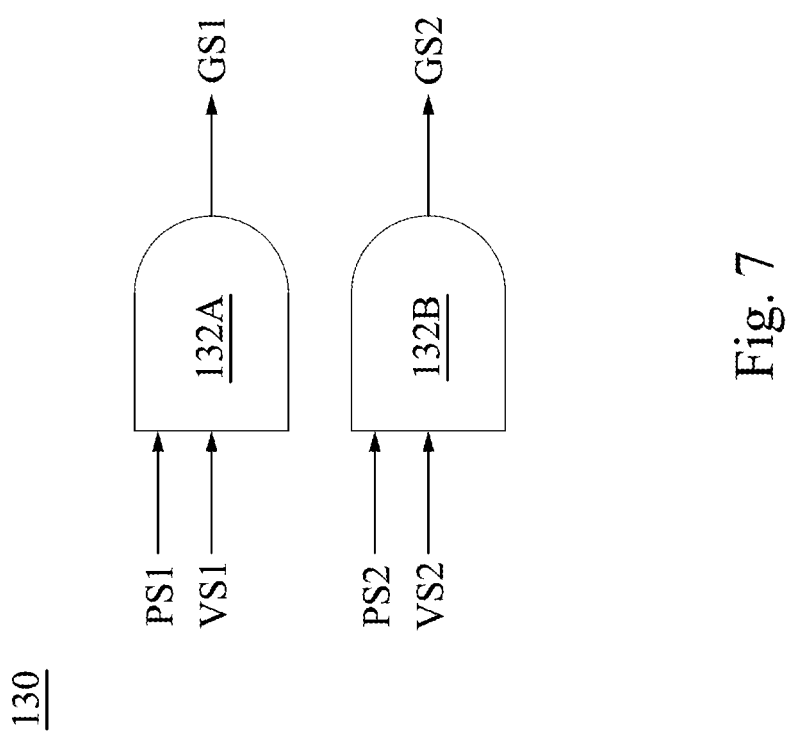

POST PACKAGE REPAIR METHOD AND POST PACKAGE REPAIR DEVICE

FIELD OF INVENTION

The invention relates to a post package repair method and a post package repair device. More particularly, the invention relates to a post package repair method and a post package repair device for a memory array.

BACKGROUND

An integrated circuit may include redundant components that can be used to substitute damaged componentry. For example, one type of memory circuit includes a dynamic random access memory (DRAM) array of memory cells. The memory cells are arranged in rows and columns, each of which is addressable for purposes of storing a bit of information. As the density of memory cells increase, the number of faulty cells also increases during the fabrication process. To reduce the effect of faulty cells, redundant memory cells, or rather redundant sections of memory cells may be used to repair a damaged section of the array, wherein the damaged section includes one or more damaged memory cells.

Once a damaged section of the integrated circuit is identified, the repair process includes replacing the damaged section with a redundant resource. Methods of replacing the damaged section with a redundant resource include the method of hard post package repair (hPPR) and soft post package repair (sPPR).

Soft post package repair (sPPR) is a way to quickly, but temporarily, repairing a row element of the memory array, contrasted to hard post package repair which takes longer but is permanent repair of a row element of the memory array. A command is received by the post package repair device so as to execute the sPPR operation or the hPPR operation. However, problems may be caused when both of the commands of executing the sPPR operation and executing the hPPR operation are received at the same time.

SUMMARY

An embodiment of this disclosure is to provide a post package repair (PPR) method. The PPR method includes the following operations: receiving a first PPR signal and a second PPR signal, in which the first PPR signal corresponds to a first PPR mode, and the second PPR signal corresponds to a second PPR mode; generating a first valid signal and a second valid signal according to the first PPR signal and the second PPR signal, in which only one of the first valid signal and the second valid signal comprises a valid information when both of the first PPR signal and the second PPR signal comprise an enabled information; in which when the first valid signal comprises the valid information, the first PPR mode is executed, and when the second valid signal comprises the valid information, the second PPR mode is executed.

An embodiment of this disclosure is to provide a post package repair device. The post package repair device includes a first logic circuit and a second logic circuit. The first logic circuit is configured to receive a first PPR signal and a second PPR signal, and to generate a first valid signal and a second valid signal according to the first PPR signal and the second PPR signal. The first PPR signal corresponds to a first PPR mode, and the second PPR signal corresponds to a second PPR mode. Only one of the first valid signal and the second valid signal includes a valid information when both of the first PPR signal and the second PPR signal include an enabled information. The second logic circuit is coupled to the first logic circuit, and the second logic circuit is configured to receive the first valid signal and the second valid signal, and to execute the first PPR mode when the first valid signal comprises the valid information, and to execute the second PPR mode when the second valid signal comprises the valid information.

The embodiment of the present disclosure is to provide a post package repair method and a post package repair device, in order to prevent error caused by commands of executing the sPPR operation and executing the hPPR operation are received at the same time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a schematic diagram illustrating a chart of PPR signals and valid signals according to some embodiments of the present disclosure.

FIG. 7 is a schematic diagram illustrating a second logic circuit according to some embodiments of the present disclosure.

DETAILED DESCRIPTION

Figure 1:
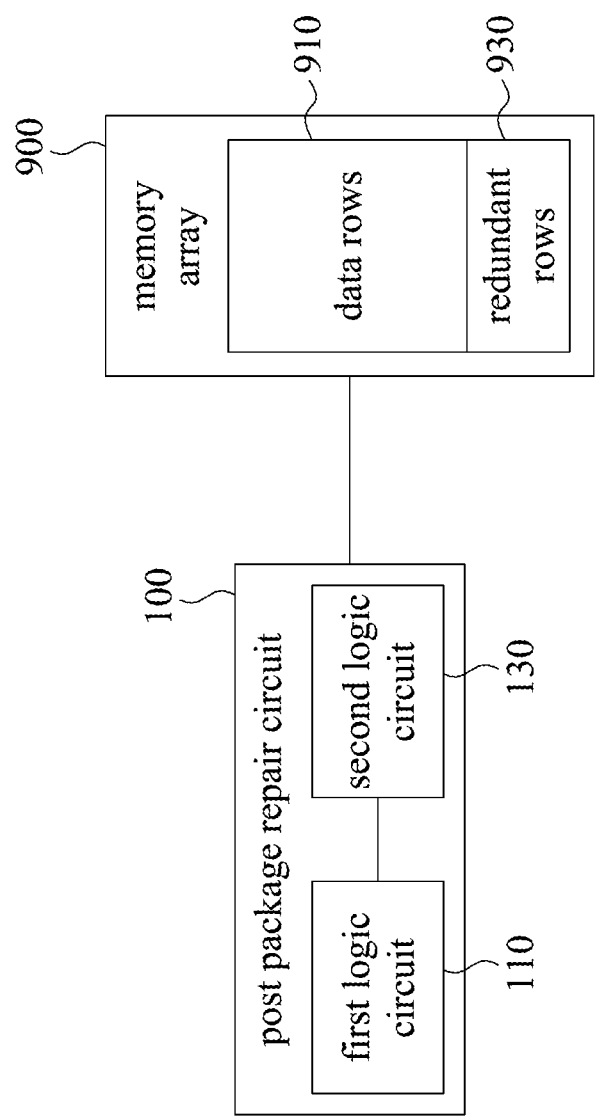
FIG. 1 is a schematic diagram illustrating a post package repair device according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram illustrating a post package repair (PPR) device 100 according to some embodiments of the present disclosure. As illustrated in FIG. 1, the PPR device 100 includes a first logic circuit 110 and a second logic circuit 130. In the connection relationship, the first logic circuit 110 is coupled to the second logic circuit 130. The PPR device 100 shown in FIG. 1 is for illustrative purposes only and the present disclosure is not limited thereto.

As illustrated in FIG. 1, the PPR device 100 is coupled to the memory array 900. The memory array 900 includes data rows 910 and redundant rows 930. In some embodiments, when a memory cell of the data rows 900 is damaged, the PPR device 100 executes soft post package repair (sPPR) operation or hard soft post package repair (hPPR) so as to replace the damaged memory cell of the memory array 900 by a memory cell of the redundant rows 930. The memory array 900 shown in FIG. 1 is for illustrative purposes only and the present disclosure is not limited thereto.

Figure 2:
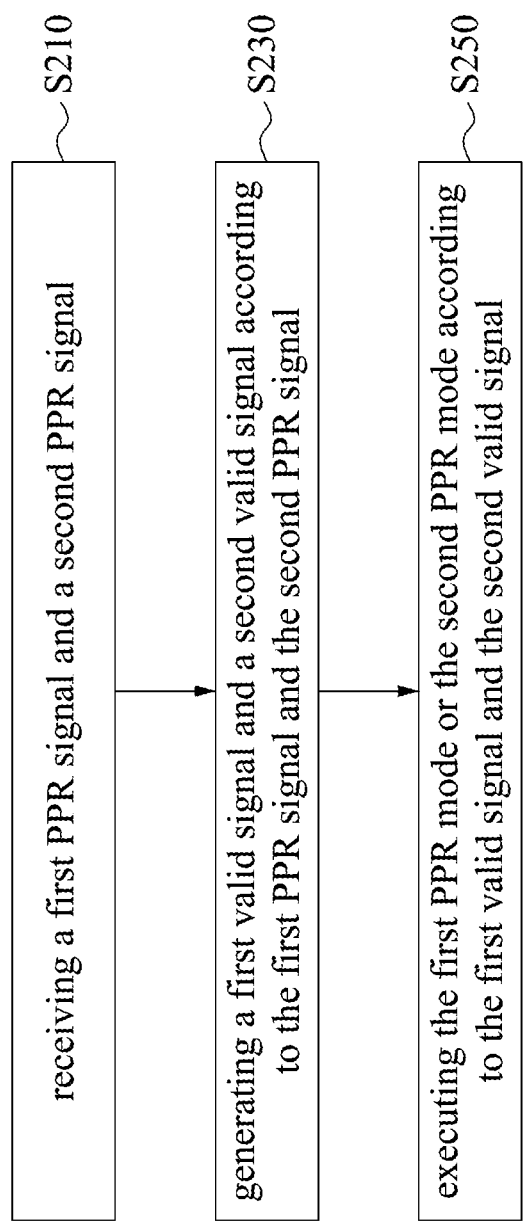
FIG. 2 is a flow chart illustrating a post package repair method according to some embodiments of the present disclosure.

Reference is made to FIG. 2. For better understanding of the present disclosure, the detailed operation of the PPR device 100 will be discussed in accompanying with the embodiments shown in FIG. 2. FIG. 2 is a flowchart illustrating the PPR method 200 in accordance with some embodiments of the present disclosure. It should be noted that the PPR method 200 can be applied to an electrical device having a structure that is the same as or similar to the structure of the PPR device 100 shown in FIG. 1. To simplify the description below, the embodiments shown in FIG. 1 will be used as an example to describe the PPR method 900 according to some embodiments of the present disclosure. However, the present disclosure is not limited to application to the embodiments shown in FIG. 1. As shown in FIG. 2, the PPR method 900 includes operations S210 to S250.

In operation S210, receiving a first PPR signal and a second PPR signal. In some embodiments, operation S210 may be operated by the first logic circuit 110 and the second logic circuit 130 as illustrated in FIG. 1. In some embodiments, the first PPR signal corresponds to a first PPR mode, and the second PPR signal corresponds to a second PPR mode. In some embodiments, the first PPR mode is the hPPR mode, and the second PPR mode is the sPPR mode.

In operation S230, generating a first valid signal and a second valid signal according to the first PPR signal and the second PPR signal. In some embodiments, operation S230 may be operated by the first logic circuit 110 as illustrated in FIG. 1.

Figure 3:
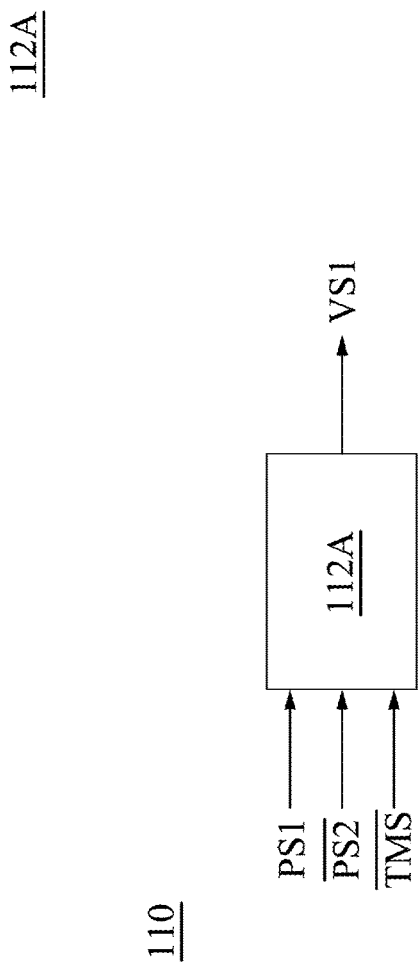
FIG. 3 is a schematic diagram illustrating a first logic circuit according to some embodiments of the present disclosure.

For details of operation S210, reference is made to FIG. 3. FIG. 3 is a schematic diagram illustrating a first logic circuit 110 as illustrated in FIG. 1 according to some embodiments of the present disclosure. As illustrated in FIG. 3, the first logic circuit 110 includes first PPR circuit 112A and second PPR circuit 112B. The first logic circuit 112A receives a reversed mode transfer signal $\overline{TMS}$, a reversed second PPR signal $\overline{PS2}$, and a first PPR signal PS1, and the first logic circuit 112A generates a first valid signal VS1 according to the reversed mode transfer signal $\overline{TMS}$, the reversed second PPR signal $\overline{PS2}$, and the first PPR signal PS1. Similarly, the second logic circuit 112B receives a reversed first PPR signal $\overline{PS1}$, a second PPR signal PS2, and a mode transfer signal TMS, and the second logic circuit 112B generates a second valid signal VS2 according to the reversed first PPR signal $\overline{PS1}$, the second PPR signal PS2, and the mode transfer signal TMS.

Figure 4:
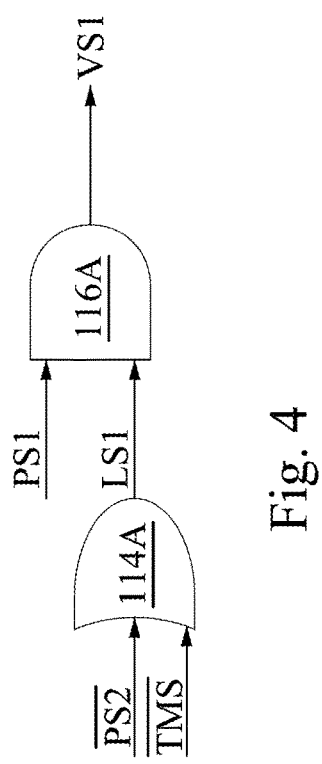
FIG. 4 is a schematic diagram illustrating a first PPR circuit according to some embodiments of the present disclosure.

Reference is made to FIG. 4. FIG. 4 is a schematic diagram illustrating a first PPR circuit 112A as illustrated in FIG. 3 according to some embodiments of the present disclosure. As illustrated in FIG. 4, the first PPR circuit 112A includes an OR circuit 114A and an AND circuit 116A. In some embodiments, the OR circuit 114A receives the reversed mode transfer signal $\overline{TMS}$ and the reversed second PPR signal $\overline{PS2}$, and the OR circuit 114A generates a first logic signal LS1 according to the reversed mode transfer signal $\overline{TMS}$ and the reversed second PPR signal $\overline{PS2}$. The AND circuit 116A receives the first logic signal LS1 and the first PPR signal PS1, and the AND circuit 116A generates the first valid signal VS1 according to the first logic signal LS1 and the first PPR signal PS1.

Figure 5:
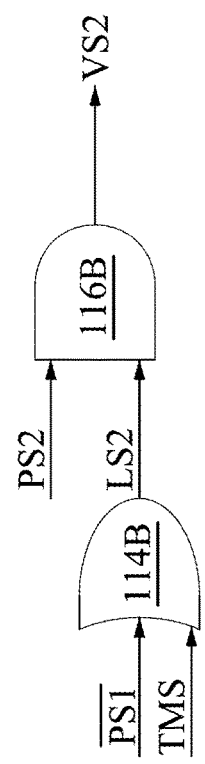
FIG. 5 is a schematic diagram illustrating a second PPR circuit according to some embodiments of the present disclosure.

Reference is made to FIG. 5. FIG. 5 is a schematic diagram illustrating a second PPR circuit 112B as illustrated in FIG. 3 according to some embodiments of the present disclosure. As illustrated in FIG. 5, the second PPR circuit 112B includes an OR circuit 114B and an AND circuit 116B. In some embodiments, the OR circuit 114B receives the reversed first PPR signal $\overline{PS1}$ and a mode transfer signal TMS, and the OR circuit 114B generates a second logic signal LS2 according to the reversed first PPR signal $\overline{PS1}$ and the mode transfer signal TMS. The AND circuit 116B receives the second logic signal LS2 and the second PPR signal PS2, and the AND circuit 116B generates the second valid signal VS2 according to the second logic signal LS2 and the second PPR signal PS2.

In some embodiments, according to the first logic circuit 110 as illustrated in FIG. 3 to FIG. 5, when both of the first PPR signal PS1 and the second PPR signal PS2 include an enabled information, only one of the first valid signal VS1 and the second valid signal VS2 includes a valid information.

To be more detailed, in some embodiments, the value of "1" represents an enabled information, and the value of "0" represents an disabled information. Similarly, the value of "1" represents a valid information, and the value of "0" represents an invalid information.

Reference is made to FIG. 6. FIG. 6 is a schematic diagram illustrating a chart of PPR signals and valid signals according to the first logic circuit 110 as illustrated in FIG. 3 to FIG. 5 according to some embodiments of the present disclosure. As illustrated in FIG. 6, when both of the first PPR signal PS1 and the second PPR signal PS2 include a value of "1", if the mode transfer signal TMS includes a value of "0", the first valid signal VS1 is "1" and the second valid signal VS2 is "0". On the other hand, when both of the first PPR signal PS1 and the second PPR signal PS2 include a value of "1", if the mode transfer signal TMS includes a value of "1", the first valid signal is "0" and the second valid signal VS2 is "1".

That is, when both of the first PPR signal PS1 and the second PPR signal PS2 include a value of "1", only one of the first valid signal VS1 and the second valid signal VS2 includes a value of "1". Furthermore, whether the first valid signal VS1 or the second valid signal VS2 includes the value of "1" is determined by the value of the mode transfer signal TMS. That is to say, the mode transfer signal TMS controls whether the first valid signal VS1 or the second valid signal VS2 comprises the valid information when both of the first PPR signal PS1 and the second PPR signal PS2 comprise the enabled information.

Therefore, as illustrated in FIG. 6, when a value of the mode transfer signal TMS is a first value, for example "0", the first valid signal VS1 includes the valid information and the second valid signal VS2 includes an invalid information when both of the first PPR signal PS1 and the second PPR signal PS2 include the enabled information. On the other hand, when the value of the mode transfer signal TMS is a second value, for example "1", the first valid signal VS1 includes the invalid information and the second valid signal VS2 includes the valid information when both of the first PPR signal PS1 and the second PPR signal PS2 include the enabled information.

Reference is made back to FIG. 2. In operation S250, executing the first PPR mode or the second PPR mode according to the first valid signal VS1 and the second valid signal VS2. In some embodiments, the operation S250 may be executed by the second logic circuit 130 as illustrated in FIG. 1.

To be more detailed, reference is made to FIG. 7. FIG. 7 is a schematic diagram illustrating a second logic circuit 130 according to some embodiments of the present disclosure. As illustrated in FIG. 7, the second logic circuit 130 includes an AND circuit 132A and an AND circuit 132B. In some embodiments, the AND circuit 132A receives the first PPR signal PS1 and the first valid signal VS1 and generates the first generating signal GS1 according to the first PPR signal PS1 and the first valid signal VS1. Similarly, the AND circuit 132B receives the second PPR signal PS2 and the second valid signal VS2 and generates the second generating signal GS2 according to the second PPR signal PS2 and the second valid signal VS2.

In some embodiments, the first PPR mode is executed when the first valid signal VS1 includes the valid information, and the second PPR mode is executed when the second valid signal VS2 includes the valid information. To be more detailed, in some embodiments, the second logic circuit 130 generates a first generating signal GS1 including the enabled information when the first valid signal VS1 includes the valid information, and the second logic circuit 130 generates a second generating signal GS2 including the enabled information when the second valid signal VS2 includes the valid information.

Since only one of the valid signals VS1 and VS2 includes a value of "1" even though both of the PPR signals PS1 and PS2 includes a value of "1", only one of the hPPR mode and the sPPR mode may be executed during a time period.

In some embodiments, the reversed mode transfer signal $\overline{TMS}$ is a reversed signal of the mode transfer signal TMS, the reversed first PPR signal $\overline{PS1}$ is a reversed signal of the PPR signal PS1, and the reversed second PPR signal $\overline{PS2}$ is a reversed signal of the PPR signal PS2. In some embodiments, the reversed signal may be generated by a reverse circuit (not shown). In some embodiments, if the original signal is "1", the reversed signal generated by the reverse circuit is "0". On the other hand, if the original signal is "0", the reversed signal generated by the reverse circuit is "1". For example, if the mode transfer signal TMS is "0", the reversed mode transfer signal $\overline{TMS}$ is "1". Contrary, if the mode transfer signal TMS is "1", the reversed mode transfer signal $\overline{TMS}$ is "0".

In some embodiments, the memory array 900 may be a dynamic random access memory (DRAM) or any other circuits with the function of data storing and/or data reading or other similar functions.

According to the embodiment of the present disclosure, it is understood that the embodiment of the present disclosure is to provide post package repair method and a post package repair device, in order to prevent error caused by commands of executing the sPPR operation and executing the hPPR operation are received at the same time.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A post package repair (PPR) method, comprising:
   receiving a first PPR signal and a second PPR signal, wherein the first PPR signal corresponds to a first PPR mode, and the second PPR signal corresponds to a second PPR mode;
   generating a first valid signal and a second valid signal according to the first PPR signal and the second PPR signal, wherein only one of the first valid signal and the second valid signal comprises a valid information when both of the first PPR signal and the second PPR signal comprise an enabled information;
   receiving a mode transfer signal, wherein the mode transfer signal controls whether the first valid signal or the second valid signal comprises the valid information when both of the first PPR signal and the second PPR signal comprise the enabled information;
   wherein when the first valid signal comprises the valid information, the first PPR mode is executed, and when the second valid signal comprises the valid information, the second PPR mode is executed.

2. The post package repair method of claim 1, wherein when a value of the mode transfer signal is a first value, the first valid signal comprises the valid information and the second valid signal comprises an invalid information when both of the first PPR signal and the second PPR signal comprise the enabled information, and wherein when the value of the mode transfer signal is a second value, the first valid signal comprises the invalid information and the second valid signal comprises the valid information when both of the first PPR signal and the second PPR signal comprise the enabled information.

3. The post package repair method of claim 1, further comprising:
   generating a first generating signal comprising the enabled information when the first valid signal comprises the valid information; and generating a second generating signal comprising the enabled information when the second valid signal comprises the valid information.

4. The post package repair method of claim 1, wherein the first PPR mode is a hard post package repair mode, and wherein the second PPR mode is a soft post package repair mode.

5. A post package repair device, comprising:
a first logic circuit, configured to receive a first PPR signal and a second PPR signal, and to generate a first valid signal and a second valid signal according to the first PPR signal and the second PPR signal, wherein the first PPR signal corresponds to a first PPR mode, and the second PPR signal corresponds to a second PPR mode, and wherein only one of the first valid signal and the second valid signal comprises a valid information when both of the first PPR signal and the second PPR signal comprise an enabled information; and
a second logic circuit, coupled to the first logic circuit, and configured to receive the first valid signal and the second valid signal, and to execute the first PPR mode when the first valid signal comprises the valid information, and to execute the second PPR mode when the second valid signal comprises the valid information;
wherein the first logic circuit is further configured to receive a mode transfer signal, wherein the mode transfer signal controls whether the first valid signal or the second valid signal comprises the valid information when both of the first PPR signal and the second PPR signal comprise the enabled information.

6. The post package repair device of claim 5, wherein when a value of the mode transfer signal is a first value, the first valid signal comprises the valid information and the second valid signal comprises an invalid information when both of the first PPR signal and the second PPR signal comprise the enabled information, and wherein when the value of the mode transfer signal is a second value, the first valid signal comprises the invalid information and the second valid signal comprises the valid information when both of the first PPR signal and the second PPR signal comprise the enabled information.

7. The post package repair device of claim 5, wherein the first logic circuit comprises:
a first PPR circuit, configured to generate the first valid signal according to a reversed mode transfer signal, a reversed second PPR signal, and the first PPR signal; and
a second PPR circuit, configured to generate the second valid signal according to the mode transfer signal, a reversed first PPR signal, and the second PPR signal.

8. The post package repair device of claim 7, wherein the first PPR circuit comprises:
an OR circuit, configured to generate a logic signal according to the reversed mode transfer signal and the reversed second PPR signal; and
an AND circuit, configured to generate the first valid signal according to the logic signal and the first PPR signal.

9. The post package repair device of claim 7, wherein the second PPR circuit comprises:
an OR circuit, configured to generate a logic signal according to the mode transfer signal and the reversed first PPR signal; and
an AND circuit, configured to generate the second valid signal according to the logic signal and the second PPR signal.

10. The post package repair device of claim 5, wherein the second logic circuit is further configured to generate a first generating signal comprising the enabled information when the first valid signal comprises the valid information, and to generate a second generating signal comprising the enabled information when the second valid signal comprises the valid information.

11. The post package repair device of claim 5, wherein the second logic circuit comprising:
a first AND circuit, configured to generate a first generating signal according to the first PPR signal and the first valid signal; and
a second AND circuit, configured to generate a second generating signal according to the second PPR signal and the second valid signal.

* * * * *